United States Patent

Nurnberg

[15] 3,648,074

[45] Mar. 7, 1972

[54] ON-OFF CONTROLLER WITH SOLID-STATE DIFFERENTIAL CIRCUIT

[72] Inventor: Richard K. Nurnberg, Norristown, Pa.

[73] Assignee: Robertshaw Controls Company, Richmond, Va.

[22] Filed: May 4, 1970

[21] Appl. No.: 34,128

[52] U.S. Cl. ..........................307/252 N, 219/510, 307/235, 307/252 F, 307/310

[51] Int. Cl. .................H03k 17/00, H05b 1/02, G05d 23/00

[58] Field of Search ...................307/252 F, 252 Q, 235, 310; 219/510

[56] References Cited

UNITED STATES PATENTS

| | | | |
|---|---|---|---|
| 3,334,244 | 8/1967 | Hanchett | 307/252 Q |
| 3,379,939 | 4/1968 | Obenhaus | 307/310 X |

*Primary Examiner*—John Zazworsky

*Attorney*—Robert L. Marben and Auzville Jackson, Jr.

[57] ABSTRACT

An on-off controller energized from an alternating current source with differential operation. The differential operation is obtained by using a solid-state circuit which introduces a resistance change in the circuitry in response to the on and off mode of the controller. The solid-state circuitry when conducting shunts the resistance used to provide the desired differential action. The shunt is removed when the solid-state circuitry is not conducting. Termination of the conducting state of the solid-state circuitry is delayed for two cycles of the alternating current. This eliminates the possibility of such termination being initiated by change in the on-off mode of the controller due to a spurious signal and prevents termination during the nonconducting portion of the alternating current cycle which is present when the controller is in the on mode.

9 Claims, 2 Drawing Figures

RICHARD K. NÜRNBERG
INVENTOR.

BY Robert L. Marben
ATTORNEY

ON-OFF CONTROLLER WITH SOLID-STATE DIFFERENTIAL CIRCUIT

BACKGROUND OF THE INVENTION

1. Field of the Invention

The invention presented herein pertains to on-off controllers and more particularly to a controller providing differential operation.

2. Description of the Prior Art

Prior art on-off controllers are known which provide differential operation. Differential action is obtained in such controllers by adding or subtracting resistance in the circuit causing a change in the signal supplied to a semiconductor switching means which controls the flow of power to a load. Prior art circuits of this type use mechanical switching provided by relay contacts or reed relay contacts to switch the resistance elements in and out of the circuit as needed for the differential action desired. Mechanical switching when so used presents a problem since low currents are involved in such circuits causing contact resistance due to contaminants, oxides, contact pressure and wear to vary sufficiently to cause the controller action to be inconsistent.

SUMMARY OF THE INVENTION

The invention presented herein provides an on-off controller with selective differential action without using mechanical switching. A differential circuit is provided using semiconductor devices for bypassing and adding resistance to the signal circuitry controlling the operation of a semiconductor switching means. The semiconductor devices for bypassing and adding resistance are operated in response to the on and off mode of the semiconductor switching means used in the controller.

Briefly, the invention is applied to an on-off controller circuit which selectively energizes a load in response to variations in the resistance of a sensor. The resistance presented by the sensor controls the triggering signal for a semiconductor current switching means. The preferred embodiment of the differential circuit includes a single transistor which is controlled in accordance with the conducting and nonconducting modes of the semiconductor switching means. The transistor is connected to conduct when the semiconductor switching means is conducting and is connected so as to shunt a resistive circuit portion when it is conducting. The resistive portion is operatively associated with the resistive sensor and is effective to alter the triggering signal for the semiconductor current switching means in accordance with presence or absence of the shunting action provided by the transistor. The resistive circuit portion that is shunted by the conduction of the transistor is adjustable to permit selection of the degree of differential desired. Means is also provided to delay the operation of the differential circuit which the semiconductor switching means is placed in the nonconducting mode. Such delay is provided to prevent operation of the differential circuit in response to momentary nonconduction of the semiconductor switching means.

The invention comprises the construction hereinafter described in conjunction with the accompanying drawing.

DESCRIPTION OF THE PREFERRED EMBODIMENT

Figure 1:
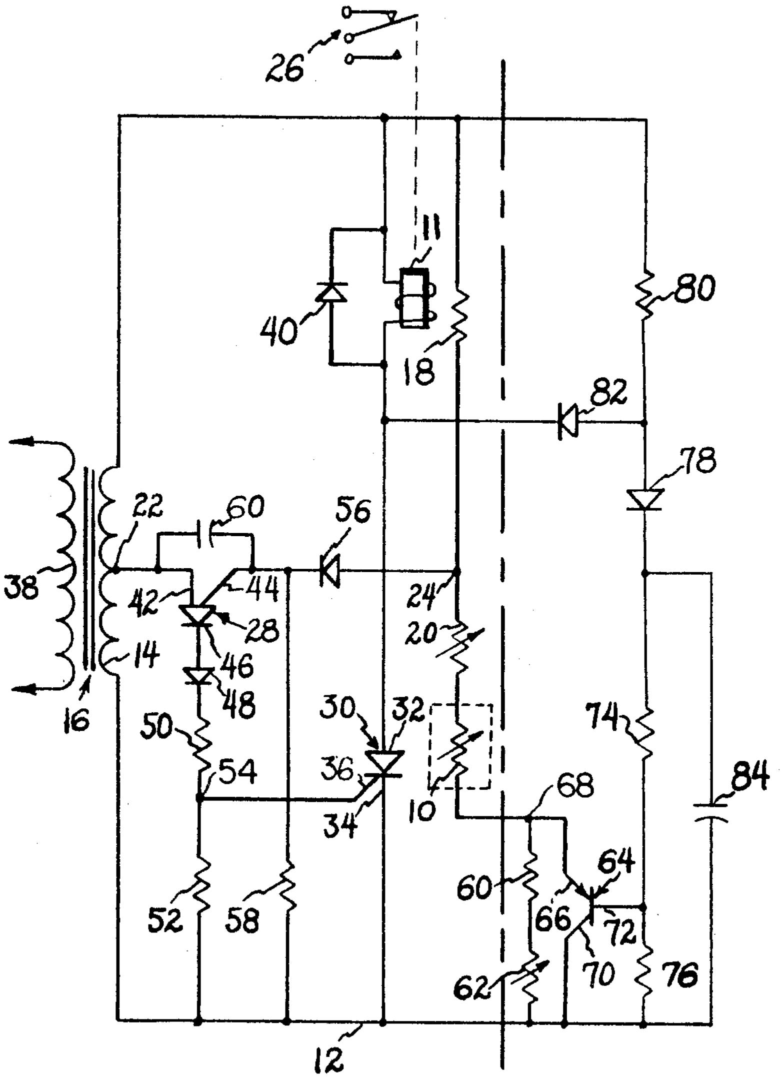
FIG. 1 is a schematic circuit of an on-off controller incorporating the preferred embodiment of the invention presented herein.

Referring to the drawing, the circuit of FIG. 1 will be considered in two parts. If the lower end of the temperature-responsive resistance 10 is considered connected directly to the common line conductor 12, the circuit portion to the left of the vertical broken line is an on-off controller circuit without any circuitry providing selective differential operation. The circuit portion to the right of the vertical broken line provides the necessary elements connected to the basic on-off controller to permit selection of a desired differential operation for the controller without the use of any mechanical switching.

The basic on-off controller circuit portion shown to the left of the broken line has two main circuit portions. One portion provides a voltage signal or triggering signal which is determined by the temperature-responsive sensor 10. The triggering signal is applied to the other circuit portion which is a semiconductor current switching means used to control the flow of power to a load which in FIG. 1 is the relay 11.

The trigger or operating signal portion, with sensor 10 being considered connected directly to the common conductor 12, includes the secondary winding 14 of transformer 16 and resistances 18 and 20 which are connected in series with sensor 10. Resistance 18 connects with the upper end of secondary winding 14. The operating signal or trigger signal is determined by the voltages present at an intermediate tap 22 on the secondary winding 14 and the connection 24 common to resistance 18 and resistance 20. So long as tap 22 is at a higher voltage than connection 24 the signal will place the semiconductor current switching means in the conducting mode to cause relay 11 to be operated. Relay contacts shown generally at 26 can be used for control purposes. For example, the contacts 26 may control a process the temperature of which is monitored or sensed by sensor 10.

The semiconductor switching means includes a programmable unijunction transistor (PUT) 28 which is controlled by the voltage present between tap 22 and connection 24. A D13T1 type programmable unijunction transistor (PUT) manufactured by the General Electric Company may be used. For convenience, PUT will be used hereinafter when referring to the programmable unijunction transistor. The PUT when conducting provides a gating signal for a silicon-controlled rectifier (SCR) 30 which has its anode 32 connected to one end of the relay coil of relay 11. The other end of the relay coil is electrically connected to the upper end of secondary winding 14. The cathode 34 of SCR 30 connects with the common conductor 12 which connects with the lower end of the secondary winding 14. Thus, SCR 30 conducts upon application of a gating signal at its gate 36 causing relay 11 to be energized.

The controller is powered from an alternating current source (not shown) which connects with the primary winding 38 of transformer 16. It is therefore necessary for the gating signal applied to the gate 36 to be positive and be applied when a positive voltage is present at the anode 32 of SCR 30. In order to keep the relay 11 energized the gating signal 36 must be presented during each positive half of each AC cycle since the SCR 30 will be turned off during the negative half of each AC cycle. A diode 40 connected across the relay coil of relay 11 prevents the relay from dropping out during the negative half of an AC cycle.

For purposes of explaining the invention sensor 10 is considered to be a resistance having a positive temperature coefficient. Thus, when the temperature at the sensor 10 is below the set point temperature of the controller as described, the voltage at connection 24 will be below the voltage at tap 22. The anode 42 of PUT 28 will be greater than the gate 44 voltage causing the PUT 28 to be turned on. Current flow from the anode 42 to the cathode 46 of PUT 28 flows through diode 48, and then to the common conductor 12 via resistance 50 connected in series with resistance 52. The connection 54 which is common to resistances 50 and 52 is connected to the gate 36 of SCR 30. The voltage developed across 52 therefore supplies a gate signal to the SCR 30 to turn it on.

The gate 44 of PUT 28 is connected to connection 24 via a diode 56 which has its anode 42 connected to connection 24. This prevents the anode 42 to gate 44 current of PUT 28 from flowing through the resistance 20 and the sensor 10. If the anode 42 to gate 44 current were permitted to flow through the resistance 20 and sensor 10 it would cause an additional voltage drop across the resistance 20 and sensor 10 and therefore influence the voltage presented at connection 24. The anode 42 to gate 44 current of PUT 28 is routed to the common conductor 12 via the resistance 58 which is connected between the gate of PUT 28 and the conductor 12. The resistance 58 is substantially much greater than the resistance 18 so there will be very little voltage drop created across the resistance 18 due to any current flow through resistance 18, diode 56 and resistance 58 when connection 24 is at a higher voltage than connection 22. The presence of resistance 58 will not, therefore, upset operation of the signal producing portion of the basic on-off controller circuitry.

A capacitor 60 is connected across the anode 42 and gate 44 electrodes of the PUT 28 to introduce a small phase shift to the PUT 28 gate so turn-on of the PUT 28, when connection 22 is greater than connection 24, will occur between 10° and 75° in the AC cycle.

Before proceeding with a description of the circuit portion shown to the right of the broken line in FIG. 1, operation of the circuit described to this point will be discussed. Operation of the circuit can be readily understood if the tap 22 is considered to be at the electrical center of secondary winding 14.

If sensor 10 is considered connected directly to the common connection 12, the transformer secondary winding 14 can be considered to form two legs of a bridge circuit with the resistance 18 forming the third leg and resistance 20 and sensor 10 forming the fourth leg. Thus, when the sum of resistance 20 and sensor 10 equals the resistance 18 the bridge circuit is balanced with no voltage difference existing between connection 24 and tap 22. Tap 22 will be at a potential greater than connection 24 until sensor 10 responds to a temperature sufficient to make the combined resistance 20 and sensor 10 greater than the resistance 18. The temperature at which this occurs is the set point temperature of the controller.

So long as sensor 10 is sensing below the set point temperature, tap 22 is of a greater potential than connection 24 causing the PUT 28 to be placed in the conducting mode. The conducting mode occurs during each positive half cycle of the alternating current. When tap 22 is positive with respect to the common conductor 12, the anode 32 of SCR 30 is also positive with respect to conductor 12. In order for SCR 30 to be placed in the conducting mode, it is only necessary that the gate 36 of SCR 30 be connected to a positive potential when the anode 32 of SCR 30 is positive. When PUT 28 is conducting its anode 42 to cathode 46 current flows through diode 48 and thence via resistances 50 and 52 to conductor 12 to place the connection 54 at a positive potential which places the SCR 30 in the conducting mode during the positive half of each alternating current cycle.

The positive potential at connection 54 is removed when the PUT 28 is no longer turned on during the positive half of the alternating current cycle. This occurs when sensor 10 is responding to a temperature equal to or in excess of the set point temperature, i.e., when resistance 20 plus the resistance of sensor 10 exceeds resistance 18. This causes point 24 to be at a higher potential than point 22 during the positive half of the alternating current cycle so the PUT 28 cannot conduct. The gate 36 of SCR 30 thus is not provided with the proper potential to place SCR 30 in the conducting mode so the relay 11 is no longer energized.

When the temperature at which sensor 10 drops below the set point temperature the tap 22 again presents a positive potential with respect to connection 24 during the positive half cycle of the alternating current causing the PUT 28 and SCR 30 to again be placed in the conducting mode.

Thus, the controller circuit as described to this point will cycle between the on and off mode at essentially the set point temperature, i.e., the circuit will have little or no temperature differential between the turn on point and the turnoff point.

It should be noted that resistance 20 is shown as variable so the set point temperature may be selected by adjustment of resistance 20. The set point adjustment could also be accomplished by having resistance 18 variable.

It can be seen that resistances 60 and 62, if connected as shown between the end of sensor 10 and the common conductor 12, were bypassed or shunted prior to the time the temperature of sensor 10 increases to the set point temperature, the controller would operate as has been described to cause relay 11 to be deenergized when the set point temperature is detected by sensor 10. It is also apparent that should the bypass or shunt be removed upon deenergization of the relay 11, the controller would not be placed in the "on" mode until the temperature at the sensor 10 has dropped so the resistance presented by sensor 10 is reduced from its resistance at the set point temperature by an amount equal to the sum of resistance 60 and 62. Such temperature is called the reset point temperature of the controller. The difference between the set point temperature and reset point temperature is the temperature differential of the controller. This temperature differential is controlled by the sum of the resistances 60 and 62. This sum is adjustable since resistance 62 is adjustable. The fixed resistance 60 is used to provide the circuit with a minimum differential as may be required.

In prior art controllers the bypassing or shunting of the differential resistance is accomplished by the use of a set of relay contacts positioned in accordance with the output relay 11. Thus, a set of contacts which are closed when relay 11 is energized could be connected across the resistances 60, 62 to provide a shunt which would be removed when relay 11 is deenergized. Such contacts carry little current since the current in the resistance legs of the bridge circuit is kept very small to minimize self-heating of the sensor 10 and the other resistances. With such low current the oxide build up on the contacts as well as other contaminants cause the shunt to present a resistance that may vary causing a variation in the set point for the controller.

The circuitry shown to the right of the vertical broken line in FIG. 1 provides a nonmechanical means for shunting the differential resistance 60 and 62. Basically, the circuitry provides for the control of a semiconductor means in accordance with the conducting and nonconducting mode of the semiconductor switching means of the controller. In FIG. 1 a single PNP-type transistor 64 is used which is connected to conduct and thus bypass or shunt the differential resistance 60 and 62 when the controller is in the on operating mode. When the controller is in the off operating mode transistor 64 is turned off so the resistance 60 and 62 is presented in the controller circuitry to provide the desired differential action.

The emitter 66 of transistor 64 is connected to connection 68 which is common to sensor 10 and resistance 60. The collector 70 connects with the common conductor 12. The bias for the base electrode 72 is developed by the series-connected resistances 74 and 76 connected between cathode of a diode 78 and the common connection 12. The base electrode 72 is connected at the connection common to resistors 74 and 76. The diode 78 has its anode connected to one end of a resistor 80. The other end of resistor 80 is connected to the upper end of the secondary winding 14. The one end of resistor 80 is also connected to the anode of a diode 82 which has its cathode connected to the anode 32 of SCR 30. The diode 78 serves to prevent discharge via the SCR 30 of a capacitor 84 connected across the resistors 74 and 76.

The biasing circuit for the transistor 64 is essentially bypassed when the SCR 30 is conducting causing the base of transistor 64 to then be close to zero potential with respect to the emitter 66. Transistor 64 therefore conducts when the SCR 30 is in the conducting mode. The coil of relay 11 is much less than the resistance 80. Relay 11 is therefore energized when the SCR 30 is conducting.

A capacitor 84 is connected across the resistors 74 and 76 and is charged via the resistor 80 and diode 78. The diode 82 prevents any charging of capacitor 84 via the coil of relay 11. The time constant for charging capacitor 84 via the resistor 80 and diode 78 is chosen so a couple of alternating current cycles are required following turnoff of the SCR 30 before the voltage at the base 72 of transistor 64 increases to turn off transistor 64 and thus remove the current bypass for the differential resistors 60 and 62. Turnoff of the SCR 30 is caused by the sensor 10 reaching the set point temperature. The temperature at sensor 10 must then drop to decrease the resistance of sensor 10 an amount sufficient to offset the presence of resistors 60 and 62 before the PUT 28 and SCR 30 are again placed in the on operating mode.

With the two-cycle requirement prior to turnoff of transistor 64, the nonconducting half cycle that is present when the SCR 30 is in the conducting mode is not effective to alter the conducting mode of the transistor 64. Such requirement also eliminates the possibility of any erratic signal that may be presented via the alternating current source from changing the mode of operating of the controller.

DESCRIPTION OF ANOTHER EMBODIMENT

Figure 2:
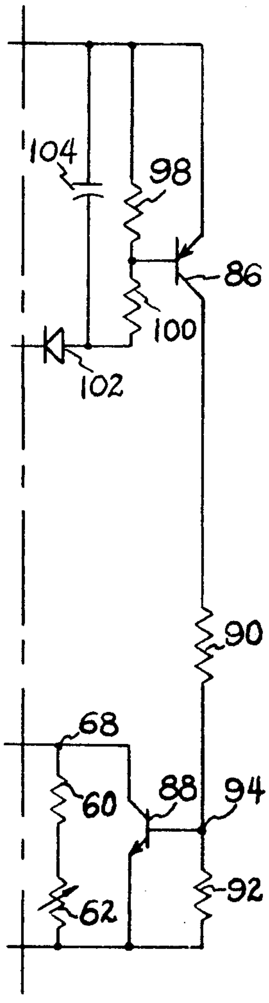
FIG. 2 is a schematic circuit illustrating another embodiment of the invention.

FIG. 2 is another embodiment of the invention which uses two transistors 86 and 88. The circuitry shown in FIG. 2 can be used in place of the circuitry shown to the right of the broken line in FIG. 1 to provide another arrangement for controlling the differential of the controller. The differential resistors 60 and 62 shown in FIG. 1 are used in the same manner in FIG. 2.

The transistor 86 is a PNP-type transistor while transistor 88 is an NPN-type transistor. Transistor 86 has its collector electrode connected to the common conductor 12 via resistances 90 and 92. The base electrode of transistor 88 is connected to the connection 94 common to resistances 90 and 92. The collector electrode of transistor 88 is connected to the connection 68 common to sensor 10 and resistance 60 while the emitter electrode of transistor 88 connects with the common conductor 12. Resistances 60 and 62 are, therefore, effectively bypassed or shunted when transistor 88 is conducting. When transistor 88 is not conducting resistances 60 and 62 are effectively a part of the bridge leg which includes resistance 20 and sensor 10.

The operating mode of transistor 86 is controlled by the operating mode of SCR 30. The emitter of transistor 86 is connected to the upper end of secondary winding 14. The base electrode of transistor 86 is connected to the upper end of secondary winding 14 via the resistance 98 and to the anode 32 of SCR 30 via the resistance 100 and diode 102. The diode 102 has its cathode connected to the anode 32 of SCR 30. Thus, when the SCR 30 is conducting the base electrode of transistor 86 is at a potential that is less than the potential of the emitter of transistor 86 causing transistor 86 to conduct. As has been explained, conduction of transistor 86 causes transistor 88 to conduct to effectively shunt the resistances 60 and 62. The sensor 10 must therefore respond to the set point temperature to terminate conduction of PUT 28 and therefore SCR 30.

When SCR 30 is in the nonconducting mode the potential at the base of transistor 86 increases to bias it off causing transistor 88 to be turned off and thus remove the shunt from resistances 60 and 62. The temperature sensed by sensor 10 must then drop to the reset temperature so sensor 10 is decreased by an amount slightly greater than the sum of resistances 60 and 62 to again cause tap 22 to have a potential above connection 24 to turn on the PUT 28. SCR 30 is turned on in response to conduction of PUT 28 to again energize the relay 11. This causes transistor 86 to be turned on which in turn causes transistor 88 to be turned on to again shunt the resistances 60 and 62.

It should be noted that a capacitor 104 is connected across the series connected resistances 98 and 100. This capacitor is used to maintain the transistor 86 in a conducting mode for two cycles of the alternating current following turn off of the SCR 30. The delay is developed by the discharge of capacitor 104 through the resistance 100 and the base of transistor 86.

The controller described provides for the controller to be in the on mode and therefore energize the relay 11 so long as the temperature is below the set point temperature. Once the set point temperature is reached the temperature sensed must drop to the reset temperature as determined by the resistance presented by the differential resistance 60 and 62. The controller is thus useful for controlling what is considered a heating process. While a sensor 10 having a positive temperature coefficient (PTC) has been used in the controller described, it will be apparent to those skilled in the art that the same type of controlling action can be obtained using a sensor 10 having a negative temperature coefficient (NTC) provided such sensor is then placed in the leg between connection 24 and the upper end of the secondary winding 14. It will also be apparent to those skilled in the art that sensor so placed which has a positive coefficient of resistance will provide a controller that could be used to control what is considered a cooling process. A controller for controlling a cooling process could also obviously be provided by using a NTC-type sensor 10 in place of the sensor 10 as positioned in FIG. 1. Such changes in the controller circuitry will not alter the portion of the circuitry disclosed for providing the differential action.

Other changes apparent to those skilled in the art can be made in the light of the above teachings. Accordingly, the scope of the invention presented herein is intended to be limited only as defined in the appended claims, which should be accorded a breadth of interpretation consistent with this specification.

What is claimed is:

1. A circuit providing differential operation of a controller having a semiconductor switching means with an on mode and off mode of operation determined by the resistance presented by a plurality of resistances connected in series, said resistances including a temperature-responsive sensor, said circuit comprising semiconductor means having an on mode and off mode of operation, said semiconductor means connected to said semiconductor switching means in a manner causing said semiconductor means to be in the on mode of operation when said semiconductor switch means is in one of its modes of operation and causing said semiconductor means to be in the off mode of operation when said semiconductor switch means is in the other of its modes of operation, said semiconductor means connected to said series of resistances providing a shunt path for a portion of said plurality of resistances when said semiconductor means is in its on mode of operation, said semiconductor means including a diode connecting with said semiconductor switching means for detecting the mode of operation of said semiconductor switching means.

2. A circuit providing differential operation of a controller having a semiconductor switching means with an on mode and off mode of operation determined by the resistance presented by a plurality of resistances connected in series, said resistances including a temperature-responsive sensor, said circuit comprising semiconductor means having an on mode and off mode of operation, said semiconductor means connected to said semiconductor switching means in a manner causing said semiconductor means to be in the on mode of operation when said semiconductor switch means is in one of its modes of operation and causing said semiconductor means to be in the off mode of operation when said semiconductor switch means is in the other of its modes of operation, said semiconductor means connected to said series of resistances providing a shunt path for a portion of said plurality of resistances when said semiconductor means is in its on mode of operation, said semiconductor means including means delaying a change of the semiconductor means from its on mode to its off mode of operation.

3. A circuit providing differential operation of a controller having a semiconductor switching means with an on mode and off mode of operation determined by the resistance presented by a plurality of resistances connected in series, said resistances including a temperature-responsive sensor, said circuit comprising semiconductor means having an on mode and off mode of operation, said semiconductor means connected to said semiconductor switching means in a manner causing said semiconductor means to be in the on mode of operation when said semiconductor switch means is in one of its modes of operation and causing said semiconductor means to be in the off mode of operation when said semiconductor switch means is in the other of its modes of operation, said semiconductor means connected to said series of resistances providing a shunt path for a portion of said plurality of resistances when said semiconductor means is in its on mode of operation, said semiconductor means including a transistor having emitter, collector and base electrodes, said emitter and collector electrodes connected at opposite ends of said portion of said plurality resistances and means connecting said base electrode to said semiconductor switching means for biasing said transistor to contact and not conduct in accordance with the on and off modes of operation of said semiconductor switching means causing said transistor to shunt said portion of said plurality of resistances when said transistor is conducting.

4. The circuit in accordance with claim 3 wherein said semiconductor means includes means connected to said transistor delaying the change of said transistor from a conducting mode to a nonconducting mode.

5. The circuit in accordance with claim 4 wherein said means delaying the change of said transistor from a conducting mode to a nonconducting mode includes a capacitor.

6. A circuit providing differential operation of a controller having a semiconductor switching means with an on mode and off mode of operation determined by the resistance presented by a plurality of resistances connected in series, said resistances including a temperature-responsive sensor, said circuit comprising semiconductor means having an on mode and off mode of operation, said semiconductor means connected to said semiconductor switching means in a manner causing said semiconductor means to be in the on mode of operation when said semiconductor switch means is in one of its modes of operation and causing said semiconductor means to be in the off mode of operation when said semiconductor switch means is in the other of its modes of operation, said semiconductor means connected to said series of resistances providing a shunt path for a portion of said plurality of resistances when said semiconductor means is in its on mode of operation, said semiconductor means including a first transistor and a second transistor, said first transistor connected to said semiconductor switching means, said first transistor being in an on mode of operation when said semiconducting switch means is in its on mode of operation and being in an off mode of operation when said semiconductor switching means is in its off mode of operation, means connecting said first and second transistor, said second transistor conducting when said first transistor is in an on mode of operation, said second transistor having its emitter and collector electrodes connected across a portion of said plurality of resistances to provide a shunt path for said portion when said second transistor is conducting.

7. The circuit in accordance with claim 6 wherein said semiconductor means includes means connected to said first transistor delaying the change of said first transistor from its on mode to its off mode.

8. The circuit in accordance with claim 7 wherein said last-mentioned means includes a capacitor.

9. The circuit in accordance with claim 1 wherein said semiconductor switching means includes a silicon-controlled rectifier and said diode is connected to the anode of said silicon controlled rectifier to conduct when said silicon-controlled rectifier is conducting.

* * * * *